US 6,712,926 B2

United States Patent
Chiang et al.

(10) Patent No.: US 6,712,926 B2
(45) Date of Patent: Mar. 30, 2004

(54) RECYCLING APPARATUS

(75) Inventors: Yuan-Yuan Chiang, Taichung (TW); Fu-Ching Tung, Hsinchu (TW); Janathan Wang, Hsinchu (TW); Peter L. Mahneke, Bucholz (DE)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/055,993

(22) Filed: Jan. 28, 2002

(65) Prior Publication Data
US 2003/0051813 A1 Mar. 20, 2003

(30) Foreign Application Priority Data

Sep. 19, 2001 (TW) ........................ 90123120 A

(51) Int. Cl.$^7$ ........................ B05C 11/08; B05C 13/00
(52) U.S. Cl. .............. 156/345.18; 134/113; 134/104.2; 451/446; 451/87
(58) Field of Search .................. 156/345.16, 345.55, 156/345.11, 345.18; 134/113, 135, 137, 104.2, 153, 157, 902; 451/446, 87; 118/602

(56) References Cited

U.S. PATENT DOCUMENTS 5,209,180 A * 5/1993 Shoda et al. .................. 118/52
5,500,081 A * 3/1996 Bergman ..................... 438/706
5,989,342 A * 11/1999 Ikeda et al. ..................... 118/52
6,220,771 B1 * 4/2001 Tung et al. .................. 396/611
6,306,455 B1 * 10/2001 Takamori et al. .............. 427/8
6,527,969 B1 * 3/2003 Tanoue et al. ................. 216/93

* cited by examiner

Primary Examiner—Gregory Mills
Assistant Examiner—Sylvia R. MacArthur
(74) Attorney, Agent, or Firm—Dickinson Wright PLLC

(57) ABSTRACT

The present invention describes a chemical solution recycling apparatus in a spin etching and cleaning process chamber for manufacturing semiconductor devices. Modification of the exterior dimension and the main structure of the process chamber is not necessary. The recycling apparatus in accordance with the present invention may separate different chemical solutions into different vessels and recycle them thereafter. The recycling apparatus comprises a recycling ring moving up and down to collect the solution and a recycling circular tray for sorting the chemical solutions in different trenches and drains. Therefore, the chemical solutions may be collected by assigned vessels or may be recycled into the process chamber after necessary quality inspections.

14 Claims, 2 Drawing Sheets

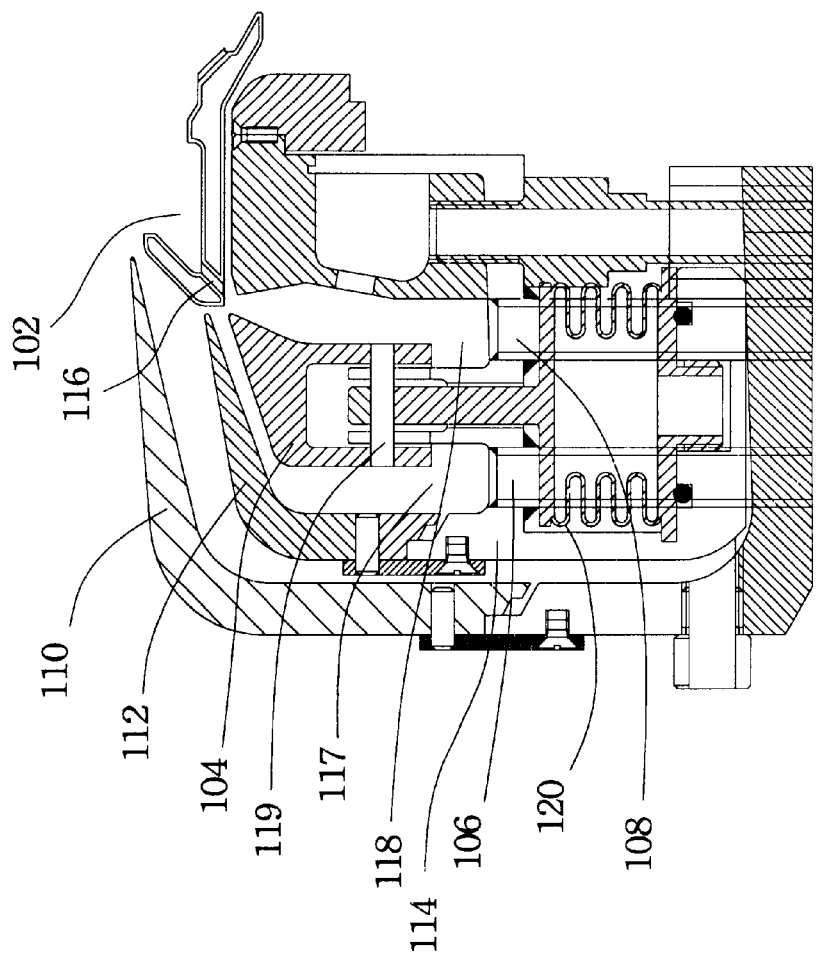

RECYCLING APPARATUS

FIELD OF THE INVENTION

The present invention relates to a chemical solution recycling apparatus used in semiconductor device manufacture. In particular, this invention relates to a chemical solution recycling apparatus of a spin cleaner used in semiconductor device manufacture.

BACKGROUND OF THE INVENTION

In the manufacturing of semiconductor devices, the etching process utilizes chemical solutions to etch away structures lacking photoresist film protection while retaining circuits having photoresist film protection. The cleaning process utilizes another chemical solution to clean the semiconductor wafer. A lot of chemical solutions are consumed, and therefore recycling and reusing are difficult when different kinds of chemical solutions are mixed together. The costs of the chemical solutions are expensive and the cost competition between the rivals is intense. How to reduce the manufacturing cost is an important consideration when purchasing equipment.

In particular, environmental protection laws all over the world are becoming increasingly strict. Manufacturer demands for equipment that reduces pollution is very strong. Therefore, reducing use of and recycling chemical solution is another important consideration.

SUMMARY OF THE INVENTION

The object of this invention is to provide a recycling apparatus which provides chemical solution recycling for the etching and cleaning process chamber of the semiconductor device manufacture without changing the outer dimensions of the present chamber.

To achieve the above and other objects, the present invention discloses a recycling apparatus of a spin etching chamber, wherein the recycling apparatus comprises a chuck for clamping and rotating a wafer and flinging out a chemical solution therein, a recycling ring for collecting the chemical solution, a shifting mechanism engaging the recycling ring controlling the recycling ring's positions, and a chemical recycling circular tray for draining out the chemical solution.

In particular, the invention further provides a recycling apparatus of a spin etching chamber, wherein the recycling apparatus comprises a chuck for clamping and rotating a wafer as well as flinging out a chemical solution therein, a plurality of recycling rings under the chuck to collect the chemical solution, a plurality of shifting mechanisms engaging the recycling rings to control the positions of the recycling rings, and a circular chemical recycling tray for draining out the chemical solutions. Therefore, the recycling apparatus may recycle different kinds of chemical solutions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 is a partial view of a chemical recycling apparatus of FIG. 1 in accordance with the present invention.

DETAILED DESCRIPTION OF THE PREFERRED EMBODIMENT

Figure 1:
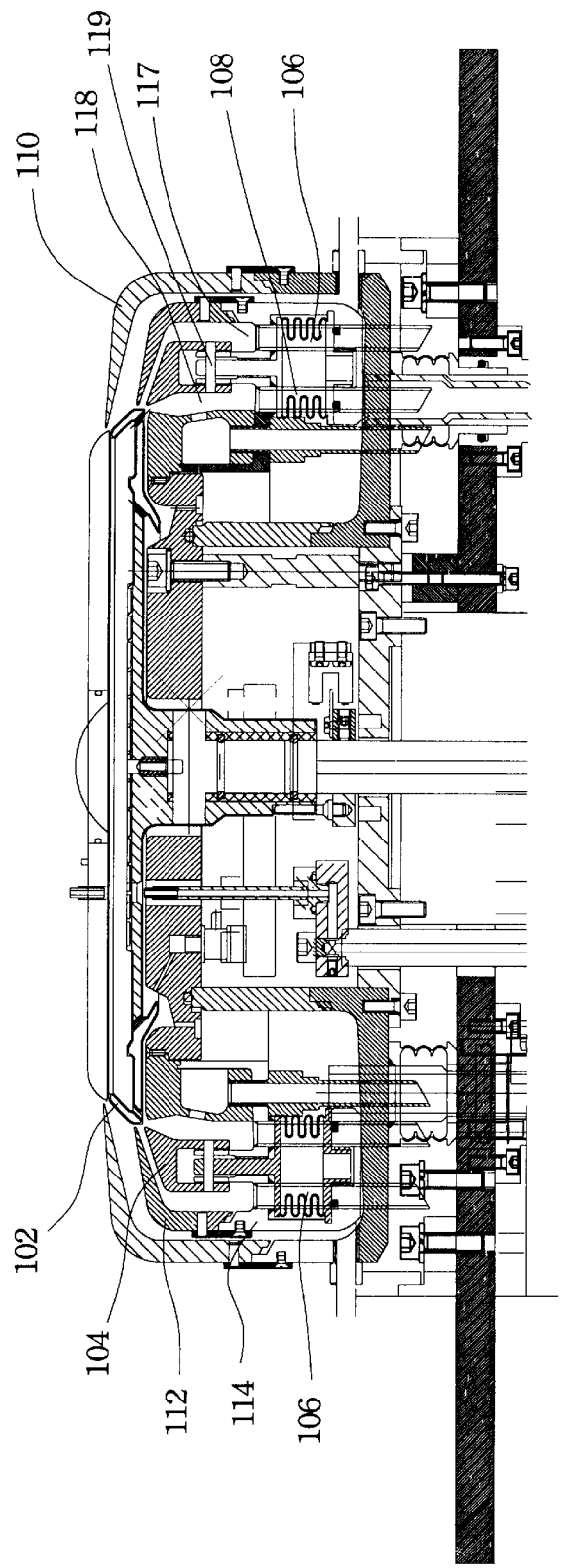
FIG. 1 illustrates a chemical recycling apparatus in accordance with one preferred embodiment of the present invention.

A preferred embodiment of the present invention discloses a chemical solution recycling apparatus in an etching and cleaning process chamber for manufacturing semiconductor devices. Modification of the exterior and the main structure of the process chamber is not necessary. The present invention may separate different chemical solutions of the manufacture process into different assigned vessels and recycle them at a later time.

FIG. 1 is an illustration of one embodiment of the present invention. As shown in the drawing of the preferred embodiment, a chuck 102 is a rotatable chuck clamping a wafer for etching and cleaning at different rotary speeds. Recycling ring 104 is a movable ring that moves up and down to collect different solutions to assigned drains. In the preferred embodiment, when the recycling ring 104 moves up until it touches the upper dead point, the chemical solution is flung out of the chuck 102, contacts the inner side of the recycling ring 104, drops into the inner trench 118 of the recycling circular tray 114 and drains out via the second drain 108. The chemical solution may then be collected by an assigned vessel. When the recycling ring 104 move down until it touches the lower dead point, the chemical solution is flung out of the chuck 102, flies over the recycling ring 104, contacts the recycling circular tray cover 112, drops into the outer trench 117 of the recycling circular tray 114 and drains out via the first drain 106. The chemical solution may then be collected by another assigned vessel or recycled into the process chamber after necessary quality inspections. In practice, the inner trench 118 accumulates and drains chemical solution when the rotating speed of the chuck 102 is lower and the outer trench 117 accumulates and drains chemical solution for direct recycling when the rotating speed of the chuck 102 is higher. Finally, shell 110 is a cover that protects the process chamber and prevents dust from dropping into the process chamber.

FIG. 2 depicts an enlarged partial cross-sectional view of FIG. 1 in accordance with the invention. In the following description of FIG. 2, elements identical to those in FIG. 1 are labeled with the same reference numbers and the description thereof is omitted. As shown in the drawing, when the recycling ring 104 moves up until it reaches the upper dead point, the chemical solution is flung out of the chuck 102 via the outlet 116, contacts the inner side of the recycling ring 104, drops into the inner trench 118 of the recycling circular tray 114 and drains out via the second drain 108. When the recycling ring 104 moves down until it reaches the lower dead point, the chemical solution is flung out of the chuck 102 via the outlet 116, flies over the recycling ring 104, touches the recycling circular tray cover 112, drops into the outer trench 117 of the recycling circular tray 114 and drains out via the first drain 106. The recycling ring 104 is controlled by the shifting bellow 120. In other words, recycling ring 104 rises when shifting bellow 120 expands and recycling ring 104 lowers when shifting bellow 120 shrinks. Shifting bellow 120 may be controlled by air pressure. The bottom side of shifting bellow 120 is attached to recycling circular tray 114. The bottom of circular recycling tray 114 is attached to the rack of the process chamber and the top side of shifting bellow 120 connects to the recycling ring 104. Thus, only the top of shifting bellow 120 may move up and down and the recycling ring 104 may move simultaneously. The shifting bellow 120, which is an independent part, is made of Teflon (trademark) and may be replaced when it wears out, whereby the expenditure of time and money is reduced. The shifting bellow 120 may connect to recycling ring 104 with a pin 119. Recycling ring 104 may serve as an umbrella and protect devices under it, for example, the pin 119 and shifting bellow 120.

It will be appreciated that although the specific embodiment of use has been presented, many modifications, alternatives and equivalents are possible. For example, the shifting bellow 120 may be replaced by a hydraulic pressure mechanism and the resultant structure would not depart from the scope and spirit of the invention. The recycling ring 104, the shifting bellow 120 and the recycling circular tray 114 may be extended to recycle more types of chemical solutions. Attached equipment such as a filter or a consistency sensor, for example, may inspect or deal with the chemical solution in the drain and recycle the chemical solution directly.

As is understood by a person skilled in the art, the foregoing preferred embodiments of the present invention are illustrative rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A recycling apparatus of a spin etching chamber, comprising:
    a chuck clamping and rotating a wafer to fling out a chemical solution in the chuck;
    a recycling ring under the chuck to collect the chemical solution when the recycling ring ascends to receive the chemical solution with an inner side of the recycling ring or when the recycling ring is lowered to receive the chemical solution with an outer side of the recycling ring;
    a shifting mechanism engaging the recycling ring to control positions of the recycling ring;
    a circular chemical recycling tray, with an inner trench, an outer trench, an inner drain, and an outer drain under the recycling ring to drain out the chemical solution by way of the inner trench and the inner drain when the recycling ring is ascended, or by way of the outer trench and the outer drain when the recycling ring is lowered; and
    a detection device for inspecting a quality of the chemical solution.

2. A recycling apparatus according to claim 1, wherein the shifting mechanism is a Teflon shifting bellow controlled by air pressure.

3. A recycling apparatus according to claim 1, wherein the recycling tray is made of Teflon, P.P. or PVC.

4. A recycling apparatus according to claim 1, wherein the chemical solution is deionized water for cleaning the wafer.

5. A recycling apparatus according to claim 1, wherein the chemical solution is hydrofluoric acid for etching the wafer.

6. A recycling apparatus according to claim 1, wherein the recycling apparatus further comprises a Teflon pin to engage the recycling ring and the shifting mechanism.

7. A recycling apparatus of a spin etching chamber comprising:
    a chuck clamping and rotating a wafer to fling out a chemical solution in the chuck;
    a plurality of recycling rings under the chuck to collect the chemical solution when the recycling ring is raised to receive chemical solution with an inner side of the recycling ring or when the recycling ring is lowered to receive chemical solution with an outer side of the recycling ring;
    a plurality of shifting mechanisms engaging the recycling rings to control positions of the recycling rings; and
    a circular chemical recycling tray, with a plurality of trenches and a plurality of drains under the recycling ring, wherein each of the trenches and each of the drains are corresponding to one corresponding recycling ring of the recycling rings to drain out the chemical solution collected by the inner side of the corresponding recycling ring.

8. A recycling apparatus according to claim 7, wherein the shifting mechanisms are a plurality of Teflon shifting bellows controlled by air pressure.

9. A recycling apparatus according to claim 7, wherein the shifting mechanisms are a plurality of pneumatic pressure mechanisms.

10. A recycling apparatus according to claim 7, wherein the recycling tray is made of Teflon, P.P. or PVC.

11. A recycling apparatus according to claim 7, wherein the chemical solution is deionized water for cleaning the wafer.

12. A recycling apparatus according to claim 7, wherein the chemical solution is hydrofluoric acid for etching the wafer.

13. A recycling apparatus according to claim 7, wherein the recycling apparatus further comprises a detection device to inspect the chemical solution.

14. A recycling apparatus according to claim 7, wherein the recycling apparatus further comprises a plurality of Teflon pins to engage the recycling rings and the shifting mechanisms.

* * * * *